(12) United States Patent
Lin et al.

(10) Patent No.: US 8,502,393 B2
(45) Date of Patent: Aug. 6, 2013

(54) CHIP PACKAGE AND METHOD FOR FORMING THE SAME

(71) Applicants: Chao-Yen Lin, New Taipei (TW);
Wen-Chou Tsai, Taoyuan (TW);
Ming-Hong Fang, Hsinchu (TW);
Jen-Yen Wang, Toufen Township (TW);
Chih-Hao Chen, New Taipei (TW);
Guo-Jyun Chiou, Zhongli (TW);
Sheng-Hsiang Fu, Zhongli (TW)

(72) Inventors: Chao-Yen Lin, New Taipei (TW);
Wen-Chou Tsai, Taoyuan (TW);
Ming-Hong Fang, Hsinchu (TW);
Jen-Yen Wang, Toufen Township (TW);
Chih-Hao Chen, New Taipei (TW);
Guo-Jyun Chiou, Zhongli (TW);
Sheng-Hsiang Fu, Zhongli (TW)

( * ) Notice: Subject to any disclaimer, the term of this patent is extended or adjusted under 35 U.S.C. 154(b) by 0 days.

(21) Appl. No.: 13/657,627

(22) Filed: Oct. 22, 2012

(65) Prior Publication Data

US 2013/0043570 A1 Feb. 21, 2013

Related U.S. Application Data

(63) Continuation of application No. 13/026,072, filed on Feb. 11, 2011, now Pat. No. 8,294,275.

(60) Provisional application No. 61/304,361, filed on Feb. 12, 2010.

(51) Int. Cl.
*H01L 23/48* (2006.01)
*H01L 23/52* (2006.01)
*H01L 29/40* (2006.01)

(52) U.S. Cl.
USPC .................................. 257/774; 257/E23.037

(58) Field of Classification Search
USPC .......................................... 257/774, E23.037
See application file for complete search history.

(56) References Cited

U.S. PATENT DOCUMENTS

| 7,271,024 B2 * | 9/2007 | Huang et al. ..................... 438/51 |
| 7,781,250 B2 * | 8/2010 | Wang et al. ..................... 438/68 |
| 2007/0132104 A1 * | 6/2007 | Farnworth et al. ............. 257/774 |

* cited by examiner

*Primary Examiner* — Jenny L Wagner
(74) *Attorney, Agent, or Firm* — Liu & Liu

(57) ABSTRACT

A chip package includes: a substrate having a first and a second surface; a device region and a pad disposed on the first surface; a hole extending from the second surface to the pad; an insulating layer located on a sidewall of the hole; a carrier substrate located on the second surface; a first redistribution layer located between the carrier substrate and the insulating layer and located in the hole to electrically contact with the pad, wherein an edge of the first redistribution layer is exposed on a sidewall formed by the carrier substrate and the insulating layer; a second redistribution layer located on the carrier substrate, extending towards the second surface, and contacting the exposed edge of the first redistribution layer; and a buffer layer located on or below the second surface of the substrate and located between the second redistribution layer and the substrate.

8 Claims, 7 Drawing Sheets

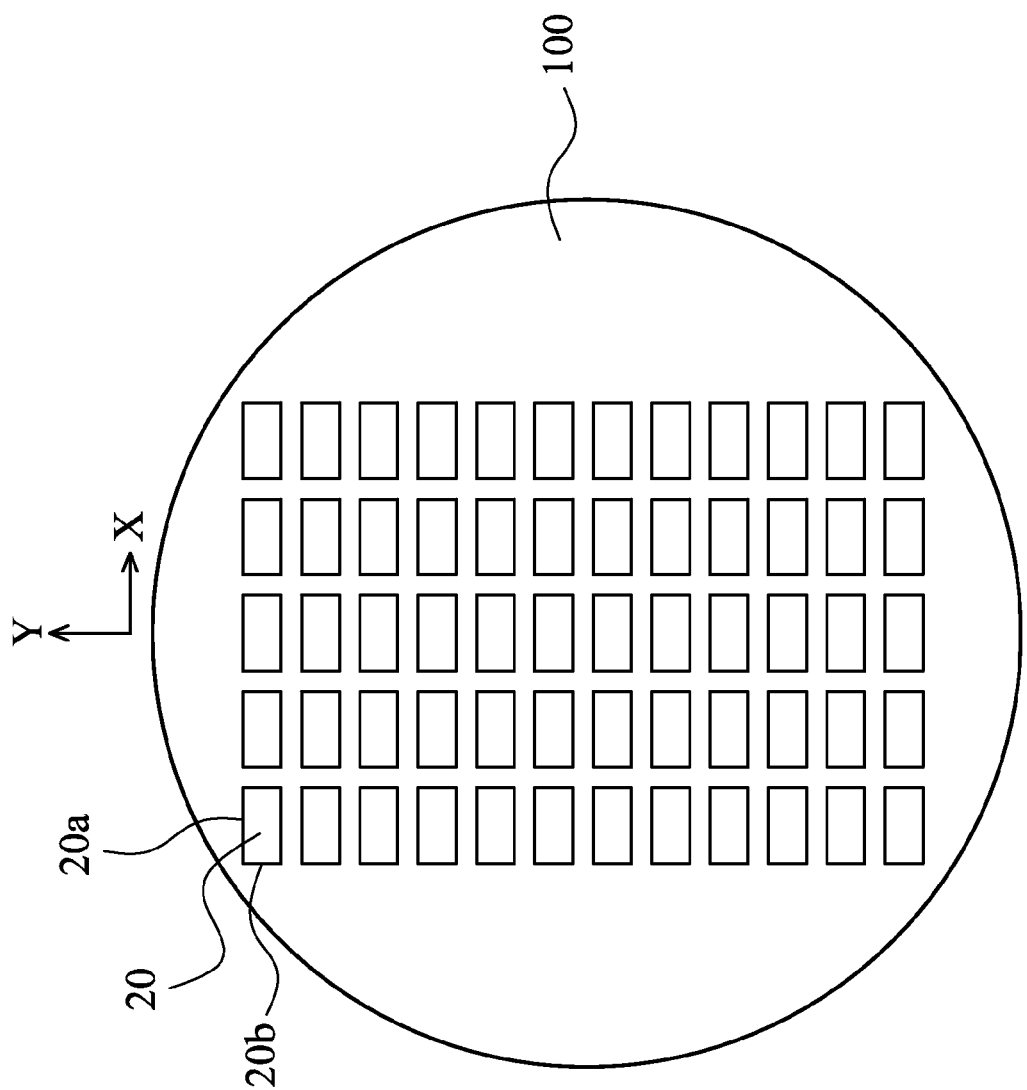

CHIP PACKAGE AND METHOD FOR FORMING THE SAME

CROSS REFERENCE TO RELATED APPLICATIONS

This Application is a Continuation of U.S. application Ser. No. 13/026,072, filed on Feb. 11, 2011 and entitled "CHIP PACKAGE AND METHOD FOR FORMING THE SAME", which claims the benefit of U.S. Provisional Application No. 61/304,361, filed on Feb. 12, 2010, the entirety of which are incorporated by reference herein.

BACKGROUND OF THE INVENTION

1. Field of the Invention

The present invention relates to a chip package and formation method thereof, and in particular relates to a wafer-level chip package.

2. Description of the Related Art

Conventional wafer-level packages may suffer with problems such as poor electrical contact, warping of wafers, shorts between conducting wires, ESD, or planarization difficulties.

Thus, a novel chip package is desired.

BRIEF SUMMARY OF THE INVENTION

An embodiment of the invention provides a chip package, which includes: a semiconductor substrate having a first surface and a second surface; a device region or sensing region and a conducting pad disposed on the first surface; a hole extending from the second surface to the conducting pad; an insulating layer located on a sidewall of the hole; a carrier substrate located on the second surface and the insulating layer; a first redistribution layer located between the carrier substrate and the insulating layer and located in the hole to electrically contact with the conducting pad, wherein an edge of the first redistribution layer is exposed on a sidewall formed by the carrier substrate and the insulating layer; a second redistribution layer located on a surface of the carrier substrate, extending towards the second surface along the sidewall formed by the carrier substrate and the insulating layer, and electrically contacting the exposed edge of the first redistribution layer; and a buffer layer located on or below the second surface of the semiconductor substrate and located between the second redistribution layer and the semiconductor substrate such that the second redistribution layer does not directly contact with the semiconductor substrate.

An embodiment of the invention provides a chip package, which includes: a semiconductor substrate having a first surface and a second surface; a device region or sensing region located on or in the semiconductor substrate; a conducting pad located on or in the semiconductor substrate and electrically connected to the device region or sensing region; a hole extending from the second surface towards the first surface and exposing the conducting pad; an insulating layer located on a sidewall of the hole; a redistribution layer located in the hole and electrically connected to the conducting pad; and a conducting layer located between the redistribution layer and the conducting pad.

An embodiment of the invention provides a chip package, which includes: a chip having a first side and a second side and having an upper surface and a lower surface, wherein the first side is larger than the second side; a plurality of first conducting pads arranged along the first side; a plurality of first trench openings arranged along the first side and extending from the lower surface towards the upper surface; a plurality of first redistribution layers, respectively, and correspondingly, located on a sidewall of one of the first trench openings and electrically connected to one of the first conducting pads; a plurality of second conducting pads arranged along the second side; a plurality of second trench openings arranged along the second side and extending from the lower surface towards the upper surface; a plurality of second redistribution layers, respectively, and correspondingly, located on a sidewall of one of the second trench openings and electrically connected to one of the second conducting pads; and a light sensitive insulating layer covering the lower surface of the chip, wherein a total amount of the light sensitive insulating layer filled into the first trench openings is smaller than or equal to a total amount of the light sensitive insulating layer filled into the second trench openings.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2 is a top view showing a chip package before being diced according to an embodiment of the present invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a sensor chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
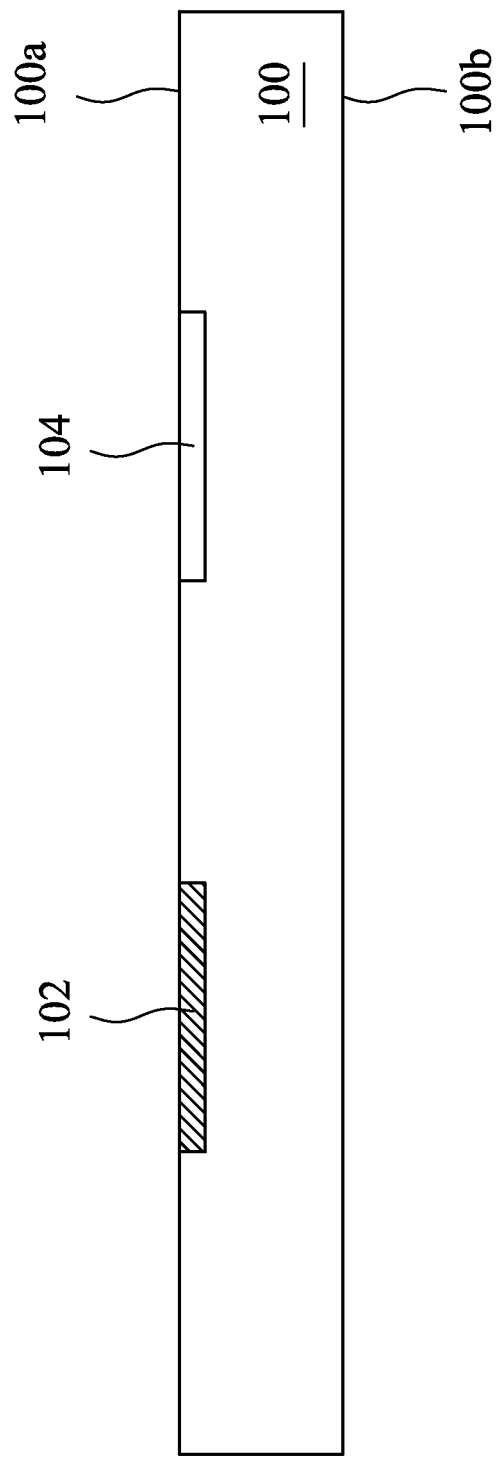
FIGS. 1A-1E are cross-sectional views showing the steps of forming a chip package according to an embodiment of the present invention.

FIGS. 1A-1E are cross-sectional views showing the steps of forming a chip package according to an embodiment of the present invention. As shown in FIG. 1A, a semiconductor substrate 100 is provided, which has a first surface 100a and a second surface 100b. The first surface 100a may be opposite to the second surface 100b. The semiconductor substrate 100 may be, for example, a semiconductor wafer having a plurality of dies (such as a silicon wafer) or a silicon substrate. In addition, at least a semiconductor device 104 and a conducting pad 102 electrically connected to the semiconductor device 104 are formed in the semiconductor substrate 100. One skilled in the art should understand that conducting routes between the semiconductor device 104 and the conducting pad 102 may be formed by many types, such as an interconnection. Thus, the conducting routes between the he semiconductor device 104 and the conducting pad 102 are not repeatedly illustrated herein and not shown in the drawings. The semiconductor device 104 may be, for example, a fingerprint recognizer, image sensor, or MEMS. For example, the semiconductor device may include a device region or sensing region. In this embodiment, the formed conducting pad 102 includes a single-layered conducting layer or multiple layered conducting layers, which may be formed of, for example, copper (Cu), aluminum (Al), or another suitable metal material. In one embodiment, a passivation layer (not shown) may be formed to cover the semiconductor substrate. For example, the device region or sensing region (104) may be covered by the passivation layer to prevent the device region or sensing region (104) from being damaged.

Figure 1B:
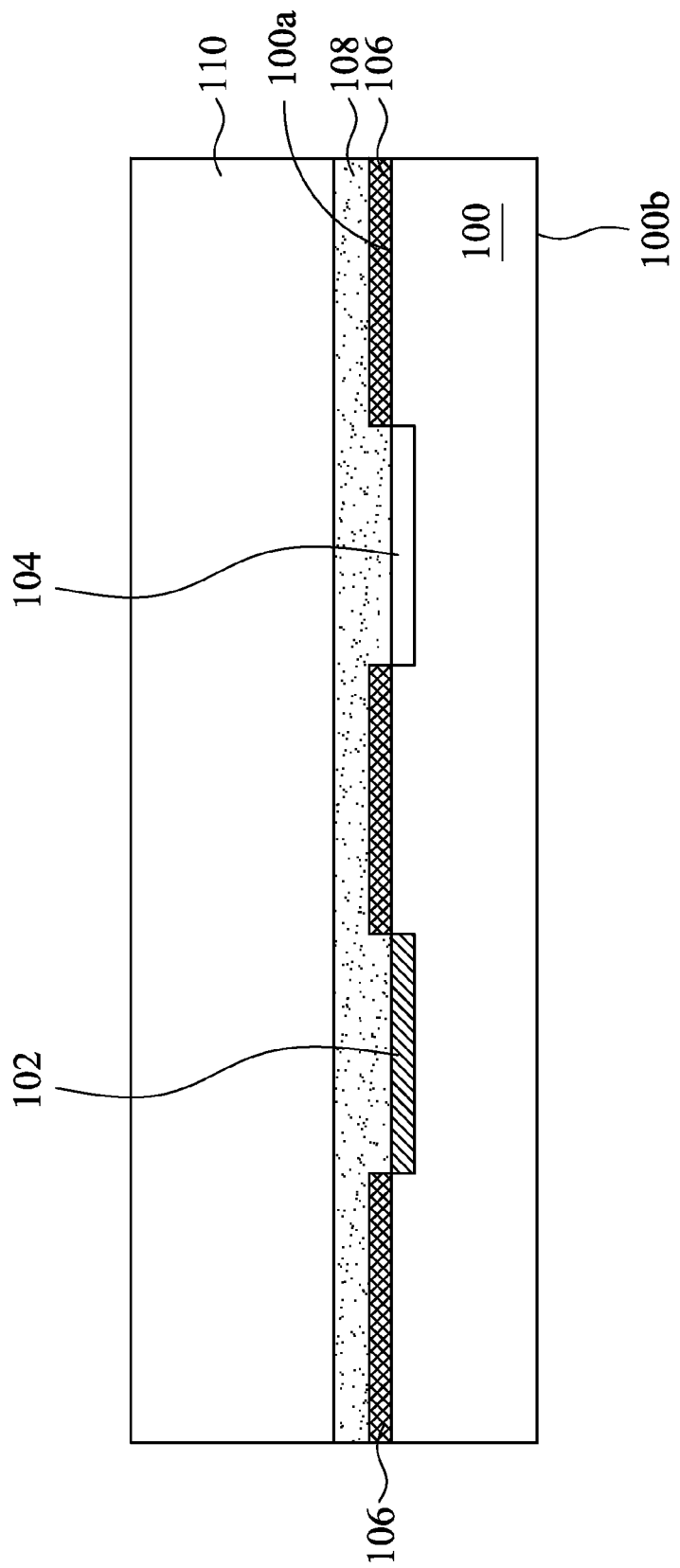

Next, referring to FIG. 1B, an ESD protecting layer 106 may be optionally formed on the first surface 100a of the semiconductor substrate 100, which can prevent the chip from suffering from ESD damage during the manufacturing process or applied usages. The material of the ESD protecting layer 106 includes a conducting material such as a metal material. For example, a metal layer may be formed on the first surface 100a of the semiconductor substrate 100. Then, the metal layer is patterned to expose the conducting pad 102 and the semiconductor device 104. In one embodiment, the patterned metal layer may serve as the ESD protecting layer 106, which may be electrically connected to a ground line (not shown) to carry a generated electrostatic current to a ground terminal (not shown) through the ground line.

Referring to FIG. 1B, a carrier substrate 110 is bonded on the semiconductor substrate 100 to facilitate following manufacturing processes. For example, the carrier substrate 110 may be bonded on the semiconductor substrate 100 through an adhesion layer 108. In addition, in a following process, the carrier substrate 110 will be removed and the adhesion layer 108 may be used as a passivation layer of the chip package. The carrier substrate 110 may be, for example, a semiconductor substrate, glass substrate, or the like. In one embodiment, in order to prevent the carrier substrate from slacking in following processes, a glue having higher adhesion is preferably used as the adhesion layer 108. In this case, the carrier substrate 110 may adopt a material which is suitable for being removed by grinding or etching to facilitate a following removing process step. Thus, in one embodiment, a substrate (such as a silicon substrate) capable of being grinded and etched is adopted as the carrier substrate 110. For example, a silicon wafer may be adopted.

Figure 1C:
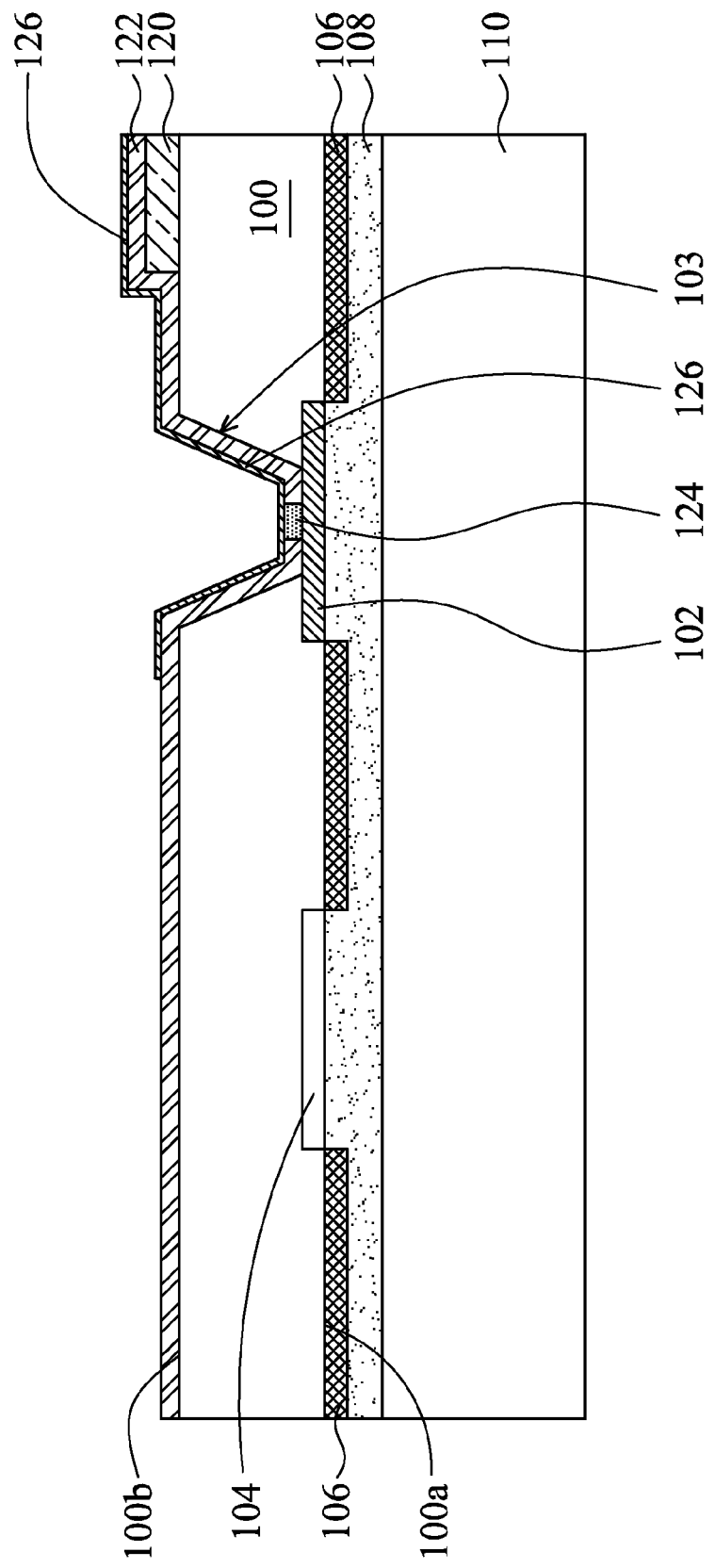

Referring to FIG. 1C, a hole 103 is formed in the semiconductor substrate 100 to expose the conducting pad 102. For example, photolithography and etching processes may be performed to partially remove the semiconductor substrate 100 from the second surface 100b of the semiconductor substrate 100 to form a hole 103 extending towards the first surface 100a.

Next, as shown in FIG. 1C, a buffer layer 120 is formed on the second surface 100b of the semiconductor substrate 100. The material of the buffer layer 120 may be, for example, (but is not limited to) a solder mask, light sensitive insulating material such as a photoresist, or another insulating material.

Then, an insulating layer 122 is formed on the second surface 100b of the semiconductor substrate 100. For example, the insulating layer 122 may be conformally formed on the second surface 100b, a sidewall and a bottom of the hole 103, and the buffer layer 120. In one embodiment, a light sensitive insulating material is used as the insulating layer 122, which can be patterned by an exposure process and a development process. Alternatively, an insulating material such as an oxide layer formed by a chemical vapor deposition process may be used as the insulating layer 122. Then, at least a portion of the insulating layer 122 on the bottom of the hole 103 is removed, such that the conducting pad 102 thereunder is at least partially exposed.

Then, a redistribution layer 126 is formed on the second surface 100b of the semiconductor substrate 100. The material of the redistribution layer 126 is a conducting material including, for example, copper, aluminum, gold, platinum, silver, or combinations thereof. Alternatively, the redistribution layer 126 may include a conducting polymer material or conducting ceramic material. The redistribution layer 126 may extend from the second surface 100b towards the bottom of the hole 103 along the insulating layer 122 on the sidewall of the hole 103 to electrically contact with the conducting pad 102.

In one embodiment, a conducting bulk (or a conducting layer) 124 may be optionally formed between the redistribution layer 126 and the conducting pad 102. Because the conducting bulk 124 protrudes from the conducting pad 102, the contact problem between the conducting pad which is embedded in the insulating layer 122 on the bottom of the hole 103 and the redistribution layer 126 may be resolved. That is, electrical connection between the redistribution layer 126 and the conducting pad 102 may be ensured through the conducting bulk 124. For example, after the step of removing a portion of the insulating layer 122 to expose the conducting pad 102, a process such as a chemical electroplating or an electroless plating process may be performed to directly form the conducting bulk 124 on the exposed conducting pad 102. The conducting bulk 124 formed by, for example, a chemical electroplating process or an electroless plating process, grows from a surface of the conducting pad 102. Therefore, the electrical connection between the conducting bulk 124 and the conducting pad 102 can be ensured.

For example, a sputtering process (not limited thereto), in company with a patterning process, may be performed to form a patterned conducting layer serving as the redistribution layer 126. In one embodiment, because the conducting bulk 124 is previously formed, a better contact surface profile is provided. Thus, it is ensured that the formed redistribution layer 126 is electrically connected to the conducting pad 102 thereunder through the conducting bulk 124. Electrical contact between the conducting pad and the redistribution layer 126 no longer fails due to blockage by the insulating layer 122. In one embodiment, because the conducting bulk 124 is formed by a chemical electroplating process, the material thereof may be different from that of the redistribution layer 126. In addition, in one embodiment, the thickness of the conducting bulk 124 may be formed to be larger than the thickness of the insulating layer 122 on the bottom of the hole 103. Thus, the conducting bulk 124 may protrude from the surface of the insulating layer 122 on the bottom of the hole 103, such that a subsequently formed redistribution layer 126 may electrically contact the conducting pad 102 through the conducting bulk 124. The electrical connection between the redistribution layer 126 and the conducting pad 102 may be achieved more easily.

Figure 1D:
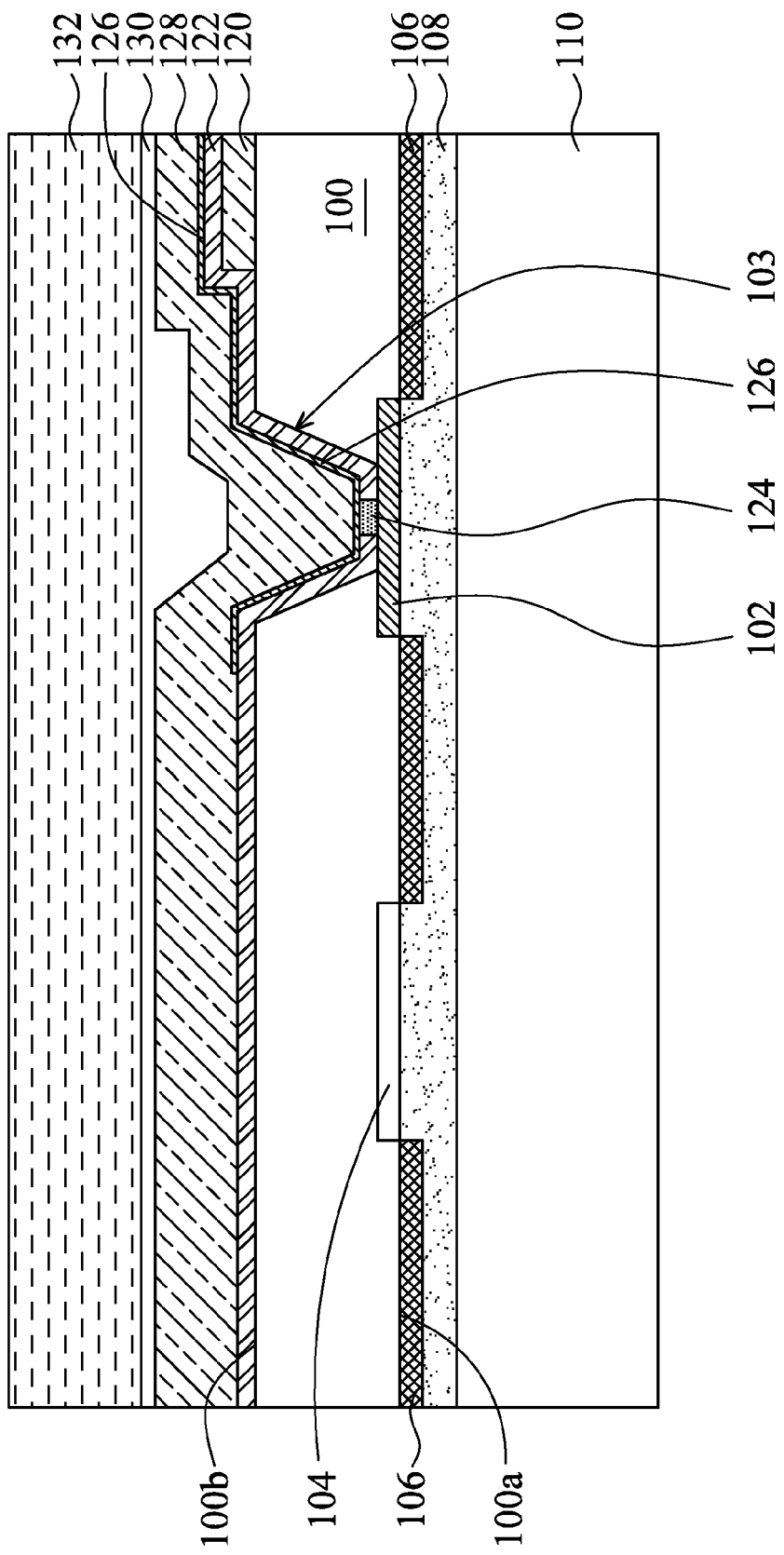

Referring to FIG. 1D, a support substrate 132 which may be, for example, (but is not limited to) a glass substrate, is then bonded on the second surface 100b of the semiconductor substrate 100. In one embodiment, the support substrate 132 is bonded on the second surface 100b of the semiconductor substrate 100 through an adhesion layer 130.

In one embodiment, before the adhesion layer 130 is formed, a filling layer 128 is optionally formed on the second surface 100b of the semiconductor substrate 100. The filling layer 128 may be filled into the hole 130 to reduce an aspect ratio of the hole 130 and provide a relatively planar surface, which facilitates following formation of the adhesion layer 130 and bonding of the semiconductor substrate 100 with the support substrate 132. The material of the filling layer 128 may be, for example, (but is not limited to) a solder mask material, photoresist material, or the like.

Figure 1E:
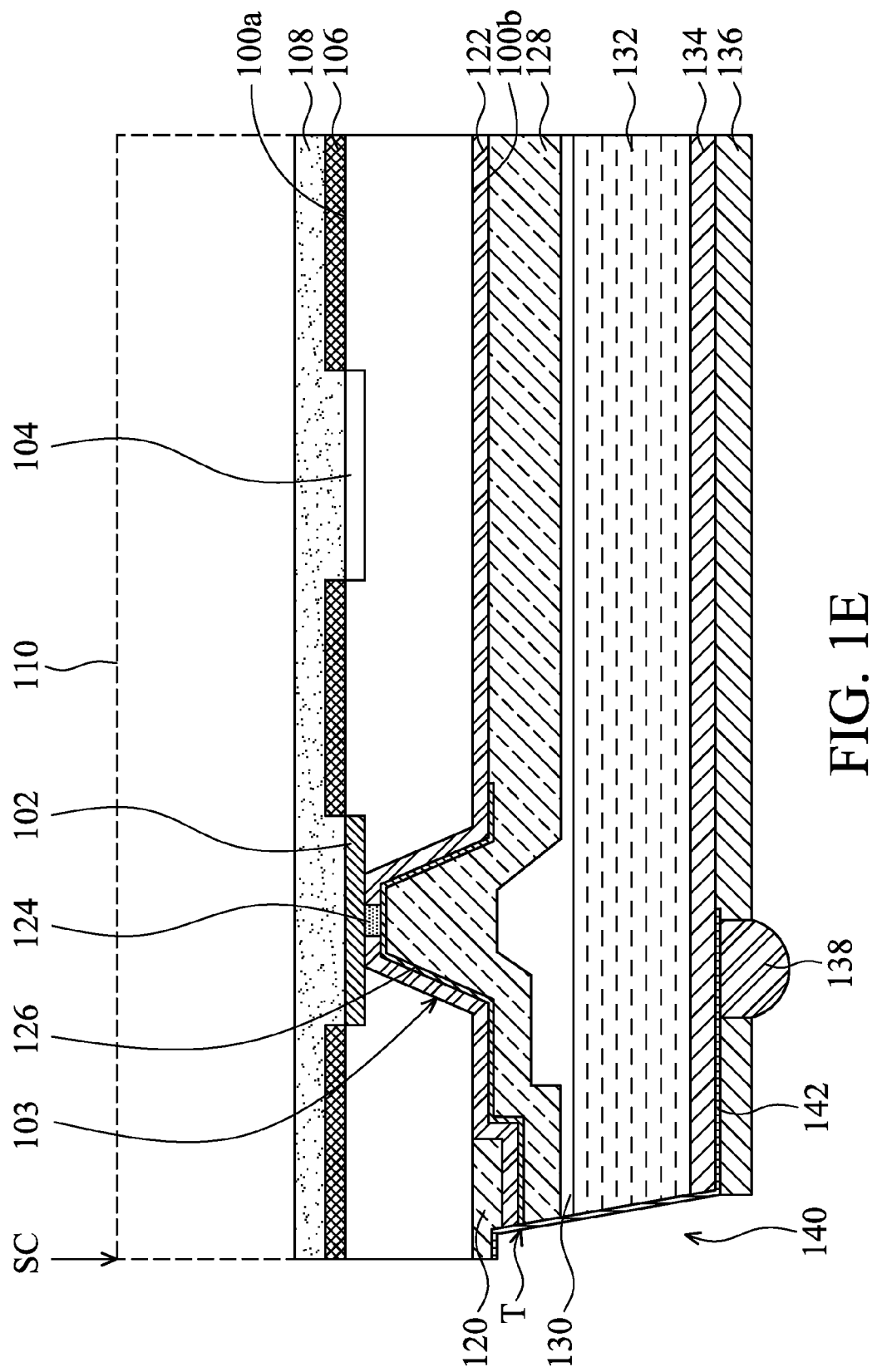

Referring to FIG. 1E, an insulating layer 134 is formed on the support substrate 132, which may be, for example, an epoxy resin or solder mask material.

As shown in FIG. 1E, a notching process is performed to a position near a predetermined scribe line SC of the semiconductor substrate 100 to form a trench opening (channel of notch) 140. The trench opening 140 extends from a sidewall of the insulating layer 134 and exposes an edge of the redistribution layer 126 from the trench opening 140, wherein the buffer layer 120 is used as a buffer such that a dicing blade used in the notching process does not penetrate the buffer layer 120 to prevent the dicing blade from cutting into the semiconductor substrate 100.

In one embodiment, only one insulating layer (i.e., the insulating layer 122) is on the bottom of the hole 103, which facilitates following formation of an opening exposing the conducting pad 102. The buffer layer 120 and the insulating layer 122 are formed on a position corresponding to a bottom of the trench opening 140. Because the total thickness of the buffer layer 120 and the insulating layer 122 is large, the semiconductor substrate 100 is ensured that it will not be cut during the notching process.

Next, referring to FIG. 1E, a redistribution layer 142 is formed on the insulating layer 134, which extends to a sidewall and a bottom of the trench opening 140 and electrically contacts with the redistribution layer 126. For example, a T contact denoted by the letter "T" is formed. A conducting material layer (not shown) such as a copper, aluminum, or nickel conducting material layer, may be deposited on the insulating layer 134 and in the trench opening 140 by, for example, a sputtering, evaporating, or electroplating process. Then, the conducting material layer is patterned by photolithography and etching processes to form the above mentioned redistribution layer 142. In this embodiment, because the buffer layer 120 is previously formed on the position of the semiconductor substrate 100 corresponding to the trench opening 140, the trench opening 140 does not extend into the semiconductor substrate 100. Thus, the redistribution layer 142 used to electrically connect the redistribution layer 126 will not contact with the semiconductor substrate 100 such that shorts between conducting wires will not occur.

In the embodiment shown in FIG. 1E, a position of an inverted point of the redistribution layer 126 extending from the sidewall of the hole to the second surface is not coplanar with a contact position (T) between the redistribution layer 126 and the second redistribution layer 142, wherein the buffer layer 120 is located on the second surface 100b.

Then, a passivation layer 136 is formed on the insulating layer 134 and the redistribution layer 142. In one embodiment, the passivation layer 136 is a light sensitive insulating material such as a photoresist or solder mask material. Then, the passivation layer 136 is patterned to form an opening exposing the redistribution layer 142. Then, a solder material is applied in the opening of the passivation layer 136 and a reflow process is performed to form a conducting bump 138. The conducting bump 138 may be a ball grid array (BGA) or land grid array (LGA) conducting bump.

Next, steps of removing the carrier substrate 110 and dicing the semiconductor substrate 100 are optionally performed to form a plurality of separate individual chip packages, as shown in FIG. 1E. Because the carrier substrate 110 may be optionally removed, the carrier substrate 110 is illustrated by dotted lines, as shown in FIG. 1E. The removing of the carrier substrate 110 may be performed by, for example, a grinding process to remove most of the material of the carrier substrate 110. Then, an etching process is performed to remove the residual portion of the carrier substrate 110. In one embodiment, a portion of the ESD protecting layer may be further exposed such that an ESD current would be led to a ground line through an external contact. The semiconductor substrate 100 is diced along the predetermined scribe line SC.

In addition, when the passivation layer 136 is formed, the passivation layer 136 usually extends from the back surface of the semiconductor substrate to the trench opening 140. In one embodiment, because the passivation layer 136 is a kind of light sensitive insulating layer such as a photoresist layer or solder mask layer, the passivation layer 136 (or light sensitive insulating layer) may be patterned depending on a situation and requirements, to at least partially remove the passivation layer 136 in the trench opening 140. For example, in the embodiment shown in FIG. 1E, the passivation layer 136 in the trench opening 140 is substantially and completely removed. However, it should be appreciated that embodiments of the present invention are not limited thereto. In another embodiment, only a portion of the passivation layer 136 in the trench opening 140 is removed.

In one embodiment, the chip encapsulated in the chip package is a chip having a longer side and a shorter side. For example, the chip encapsulated in the chip package is a rectangular chip. FIG. 2 is a top view showing a chip package before being diced according to an embodiment of the present invention, wherein same or similar reference numbers are used to designate same or similar elements.

As shown in FIG. 2, in one embodiment, the semiconductor substrate 100 is a semiconductor wafer having a plurality of chips 20 formed thereon, which will be diced and separated from each other in a following dicing process. In this embodiment, each of the chips 20 has a first side 20a and a second side 20b, wherein a length of the first side 20a is larger than a length of the second side 20b. In this case, referring to FIG. 1E, the passivation layer 136 in the trench openings 140 arranged along the first side 20a of each of the chips 20 may be at least partially removed or completely removed. That is, for a single chip package 20, the passivation layer 136 in each of the trench openings 140 arranged along the longer first side 20a is at least partially or completely removed, such that, for example, the amount of the passivation layer 136 in the trench openings arranged along the longer sides (20a) is less than or equals to the amount of the passivation layer 136 in the trench openings arranged along the shorter sides (20b). In other words, the total amount of the passivation layer 136 (the light sensitive insulating layer) filled into the trench openings arranged along the longer side 20a is smaller than or equal to the total amount of the passivation layer 136 (the light sensitive insulating layer) filled into the second trench openings arranged along the side 20b. Thus, for the whole semiconductor wafer (100), the problem where an accumulated total amount of the passivation layer 136 of the longer sides (x direction) is too large, may be reduced. Thus, during a following heating process, warping of the semiconductor wafer (100) caused by nonuniform shrinkage of the passivation layer 136 along longer sides and shorter sides thereof may be prevented.

In addition, embodiments of the present invention may have various changes without departing from the spirit and scope of the present invention. Referring to FIGS. 1C and 1E, in this embodiment, because the buffer layer 120 is previously formed (FIG. 1C), the trench opening 140 is prevented from extending into the semiconductor substrate 100 during the notching process (FIG. 1E). Thus, short caused by contact between a subsequently formed redistribution layer 142 and the semiconductor substrate 100 is prevented.

Figure 3:
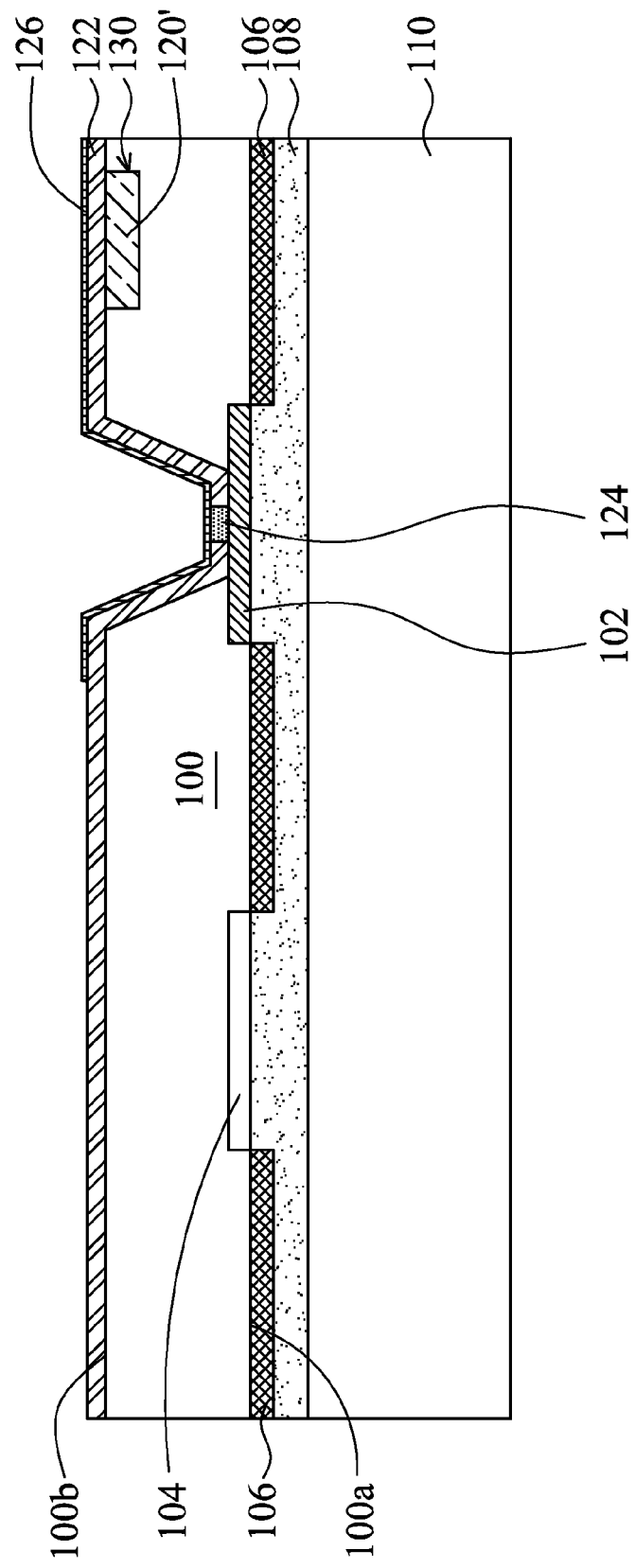
FIG. 3 is a cross-sectional view showing a chip package obtained from an intermediate process stage according to an embodiment of the present invention.

However, embodiments of the present invention are not limited thereto. In another embodiment, such as that shown in FIG. 3, a recess 30 may have been previously formed at a position where the buffer layer 120 is originally formed. Then, a buffer layer 120' is filled into the recess 30 to replace the buffer layer 120 shown in the embodiment shown in FIG. 1. Thus, during the following notching process (for example, see FIG. 1E), even if the formed trench opening is formed, the trench opening merely extends into the buffer layer 120' in the recess 30 without further extending into the semiconductor substrate 100, thus further preventing short from occurring between a subsequently formed redistribution layer and the semiconductor substrate 100. In this case, the portion of the redistribution layer 126 outside of the hole 103, such as the portion extending to the position of T contact, is located on the planar insulating layer 122. Thus, compared with the embodiment shown in FIG. 1E, the redistribution layer 126 has less inverted point, wherein the structure of the redistribution layer 126 may be more stable and conducting wires are not easily broken. In other words, in this case, a position of the inverted point of the redistribution layer 126 extending from the sidewall of the hole to the second surface will be substantially as high as a contact position between the redistribution layer 126 and the second redistribution layer, wherein the buffer layer 120' is located below the second surface 100b and a lower surface of the buffer layer is substantially coplanar with the second surface 100b.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a semiconductor substrate having a first surface and a second surface;
a device region or sensing region and a conducting pad disposed on the first surface;
a hole extending from the second surface to the conducting pad;
an insulating layer located on a sidewall of the hole;
a carrier substrate located on the second surface and the insulating layer;
a first redistribution layer located between the carrier substrate and the insulating layer and located in the hole to electrically contact with the conducting pad, wherein an edge of the first redistribution layer is exposed on a sidewall formed by the carrier substrate and the insulating layer;
a second redistribution layer located on a surface of the carrier substrate, extending towards the second surface along the sidewall formed by the carrier substrate and the insulating layer, and electrically contacting the exposed edge of the first redistribution layer; and
a buffer layer located below the second surface of the semiconductor substrate and located between the second redistribution layer and the semiconductor substrate such that the second redistribution layer does not directly contact with the semiconductor substrate.

2. The chip package as claimed in claim 1, wherein a position of an inverted point of the first redistribution layer extending from the sidewall of the hole to the second surface is substantially as high as a contact position between the first redistribution layer and the second redistribution layer, wherein the buffer layer is located below the second surface and a lower surface of the buffer layer is substantially coplanar with the second surface.

3. The chip package as claimed in claim 1, wherein an adhesion layer is between the carrier substrate and the insulating layer, the adhesion layer directly contacts with the carrier substrate, and a contact interface between the adhesion layer and the carrier substrate is substantially planar.

4. The chip package as claimed in claim 3, further comprising a filling layer located between the adhesion layer and the first redistribution layer.

5. The chip package as claimed in claim 4, wherein the filling layer substantially and completely fills the hole.

6. The chip package as claimed in claim 1, further comprising an ESD protecting layer located on the first surface of the semiconductor substrate, wherein the ESD protecting layer does not cover the device region or sensing region.

7. The chip package as claimed in claim 6, wherein the ESD protecting layer does not cover the conducting pad.

8. The chip package as claimed in claim 6, further comprising a passivation layer covering the semiconductor substrate, the device region or sensing region, the conducting pad, and the ESD protecting layer, wherein a material of the passivation layer is a material solidified from an adhesive glue.

* * * * *